United States Patent
Chang et al.

(10) Patent No.: US 10,777,531 B2
(45) Date of Patent: Sep. 15, 2020

(54) PACKAGE CONTACT STRUCTURE, SEMICONDUCTOR PACKAGE AND MANUFACTURING METHOD THEREOF

(71) Applicant: Taiwan Semiconductor Manufacturing Co., Ltd., Hsinchu (TW)

(72) Inventors: Jung-Hua Chang, Hsinchu (TW); Chin-Fu Kao, Taipei (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 0 days.

(21) Appl. No.: 16/234,568

(22) Filed: Dec. 28, 2018

(65) Prior Publication Data

US 2020/0212006 A1   Jul. 2, 2020

(51) Int. Cl.
| | | |
|---|---|---|
| H01L 25/065 | (2006.01) | |
| H01L 23/538 | (2006.01) | |
| H01L 23/31 | (2006.01) | |
| H01L 23/528 | (2006.01) | |
| H01L 21/56 | (2006.01) | |
| H01L 25/00 | (2006.01) | |
| H01L 21/48 | (2006.01) | |

(52) U.S. Cl.
CPC ...... *H01L 25/0652* (2013.01); *H01L 21/4853* (2013.01); *H01L 21/56* (2013.01); *H01L 23/3107* (2013.01); *H01L 23/5386* (2013.01); *H01L 25/50* (2013.01)

(58) Field of Classification Search
CPC . H01L 25/0652; H01L 21/56; H01L 23/5386; H01L 21/563
See application file for complete search history.

(56) References Cited

U.S. PATENT DOCUMENTS

| | | | |
|---|---|---|---|
| 9,000,584 B2 | 4/2015 | Lin et al. | |
| 9,048,222 B2 | 6/2015 | Hung et al. | |
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 2015/0145130 A1* | 5/2015 | Lin | H01L 23/49838 257/738 |
| 2015/0179607 A1* | 6/2015 | Ho | H01L 21/76251 438/118 |
| 2016/0307872 A1* | 10/2016 | Chen | H01L 21/4857 |
| 2017/0287800 A1* | 10/2017 | Ishii | H01L 24/19 |
| 2019/0119435 A1* | 4/2019 | Asai | C08J 5/005 |

* cited by examiner

*Primary Examiner* — Changhyun Yi
(74) *Attorney, Agent, or Firm* — JCIPRNET

(57) ABSTRACT

A package contact structure, a semiconductor package and a manufacturing method are provided. The package contact structure includes a conductive feature and a dielectric barrier. The conductive feature includes a first portion and a second portion disposed on the first portion. Materials of the first portion and the second portion are different. The dielectric barrier is sleeved on the first portion and extends to cover at least a part of the second portion. A maximum height of the dielectric barrier is less than a maximum height of the conductive feature.

20 Claims, 15 Drawing Sheets

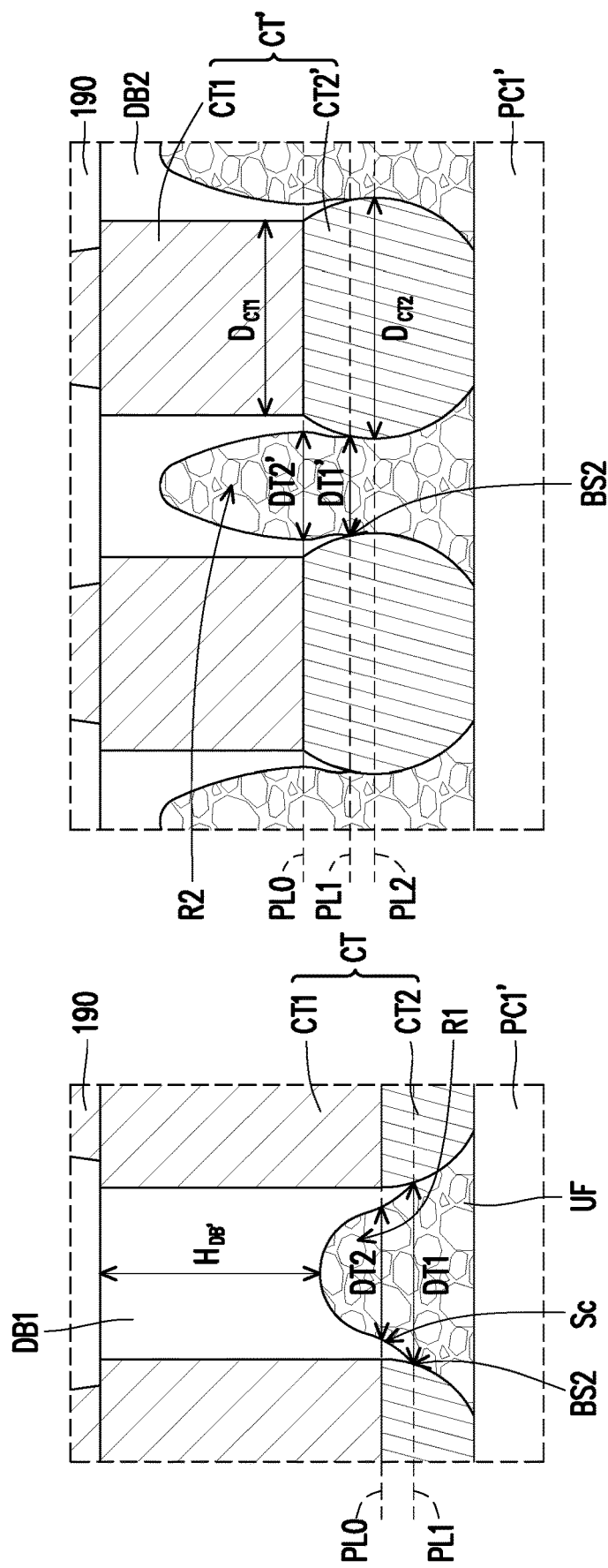

PACKAGE CONTACT STRUCTURE, SEMICONDUCTOR PACKAGE AND MANUFACTURING METHOD THEREOF

BACKGROUND

The semiconductor industry has experienced rapid growth due to continuous improvements in the integration density of a variety of electronic components (e.g., transistors, diodes, resistors, capacitors, etc.). In an aspect of conventional semiconductor packaging technologies, such as integrated fan-out wafer level packaging (InFO-WLP), a molding layer may be formed around semiconductor dies to protect the semiconductor dies and support the fan-out interconnect structures formed thereon. Redistribution layers (RDLs) including circuit routing layers may be formed over the semiconductor dies and the molding layer, and may be electrically connected to the active devices in the semiconductor dies. Moreover, conductive contacts may be formed over the RDLs in order to provide further electrical connection to electronic devices.

As the demand for miniaturization, higher speed and greater bandwidth, as well as lower power consumption and latency has grown recently, semiconductor packages need to have increasingly greater numbers of conductive contacts formed into smaller areas, and the density of the conductive contacts rises over time. As a result, undesired bridging issues easily occur due to the finer pitch between adjacent conductive contacts and wafer warpage problem. Such issues form an undesired electrical coupling between the conductive contacts leading to electrical short circuits. On the other hand, the semiconductor dies may be integrated as part of a larger system or integrated circuit (e.g., a three-dimensional integrated circuit (3DIC)), which may be formed by stacking and interconnecting semiconductor dies on top of one another. Accordingly, there has grown a need for smaller, more reliable and more creative semiconductor packaging techniques.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A to FIG. 2J are schematic cross-sectional views of various stages of manufacturing a semiconductor package in accordance with some exemplary embodiments of the disclosure.

FIG. 5B is a schematic, enlarged cross-sectional view of the dashed area D outlined in FIG. 5A in accordance with some exemplary embodiments of the disclosure.

FIG. 6 is a schematic, enlarged cross-sectional view illustrating an area of a semiconductor device between a first package component and a second package component in accordance with some exemplary embodiments of the disclosure.

DETAILED DESCRIPTION

Figure 1A:
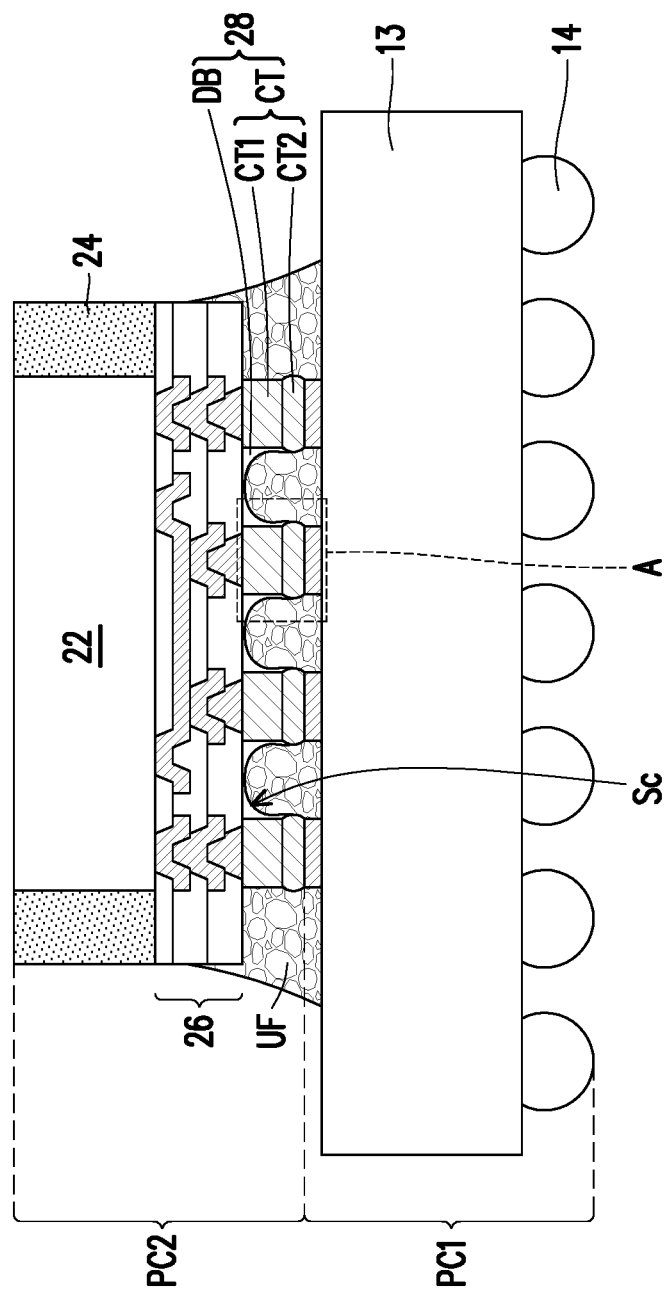
FIG. 1A is a schematic cross-sectional view illustrating a semiconductor device in accordance with some exemplary embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

A semiconductor package including package contact structures and the manufacturing method thereof are provided in accordance with various embodiments. A semiconductor device including the semiconductor package is provided in accordance with some embodiments. The intermediate stages of forming a semiconductor package are illustrated in accordance with some embodiments. Some variations of some embodiments are discussed. It should be appreciated that the illustration throughout the drawings are schematic and not in scale. Throughout the various views and illustrative embodiments, the identical or similar numbers refer to the identical or similar elements.

Figure 1B:
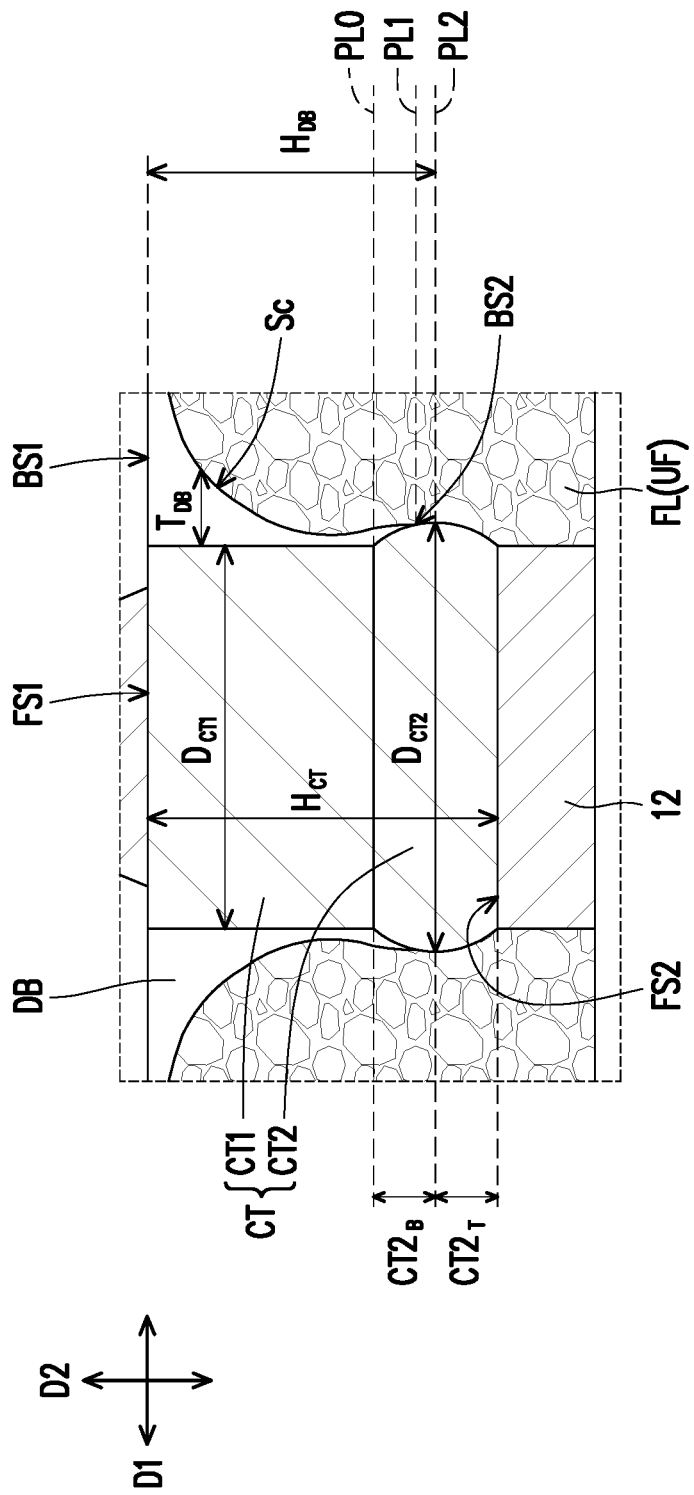
FIG. 1B is a schematic, enlarged cross-sectional view of the dashed area A outlined in FIG. 1A.

FIG. 1A is a schematic cross-sectional view illustrating a semiconductor device according to some embodiments of the present disclosure, and FIG. 1B is a schematic, enlarged cross-sectional view of the dashed area A outlined in FIG.

1A. Referring to FIG. 1A and FIG. 1B, a semiconductor device SD1 includes a first package component PC1 and a second package component PC2 bonded to the first package component PC1. For example, the first package component PC1 may be an interposer (with or without active/passive devices), a device die, a mounting substrate, a packaging substrate, a circuit board, combinations thereof, or the like. In some embodiments, the first package component PC1 includes a circuit carrier 13 and external terminals 14 formed on a lower surface of the circuit carrier 13. For example, the circuit carrier 13 includes a circuitry structure (not shown) having patterned conductive layers and patterned dielectric layers stacked alternately. In some embodiments, the circuit carrier 13 further includes a core structure (not shown) for enhancing the rigidity of the circuitry structure. The external terminals 14 may be electrically connected to the circuitry structure of the circuit carrier 13. For example, the external terminals 14 include solder balls or other suitable conductive balls/bumps/pillars arranged in a grid array for further electrical connection.

The second package component PC2 may be disposed on an upper surface of the circuit carrier 13 opposite to the external terminals 14. In some embodiments, the second package component PC2 includes an insulating encapsulation 24 and an integrated circuit (IC) component structure 22 laterally encapsulated by the insulating encapsulation 24. The IC component structure 22 may include a logic die, a memory die, a power management die, a radio frequency (RF) die, a sensor die, a micro-electro-mechanical-system (MEMS) die, a signal processing die, a front-end die, the like, or a combination thereof. In some embodiments, the IC component structure 22 includes more than one dies electrically coupled to one another to perform multi-functions as will be discussed in greater detail later accompany with other embodiments. The second package component PC2 may further include redistribution layer (RDL) structure 26 formed over the IC component structure 22 and the insulating encapsulation 24. The RDL structure 26 includes conductive elements (e.g., conductive lines, conductive pads, conductive vias, etc.) for rerouting the electrical signal of the IC component structure 22 and expanding the circuitry wider than the size of the IC component structure 22.

In some embodiments, a package contact structure 28 of the second package component PC2 is formed over the RDL structure 26 opposite to the IC component structure 22 and the insulating encapsulation 24. The package contact structure 28 may be configured to electrically connect the first package component PC1 to the second package component PC2. For example, the package connector structure 28 is electrically connected to IC component structure 22 by way of conductive elements of the RDL structure 26 to provide conductive regions for contact between the RDL structure 26 and the circuit carrier 13.

For example, the package contact structure 28 includes a conductive contact CT and a dielectric barrier DB. For example, the conductive contact CT includes a first portion CT1 and a second portion CT2 disposed on the first portion CT1. In some embodiments, a material of the first portion CT1 is different from a material of the second portion CT2. For example, the first portion CT1 is a metallic layer including substantially pure copper, aluminum-copper alloy, or other metallic materials such as tungsten, nickel, palladium, gold, and alloys thereof. The second portion CT2 may be formed of a solder layer including alloy of tin, lead, silver, copper, nickel, bismuth, combinations thereof, or the like. Such solder layer may be lead-free or lead-containing. The conductive contact CT may include conductive bumps arranged in an array. For example, the conductive contact CT includes controlled collapse chip connection (C4) bumps, micro-bumps, conductive pillars, electroless nickel-electroless palladium-immersion gold technique (ENEPIG) formed bumps, combination thereof (e.g., a metal pillar having a solder cap attached thereof), or the like.

In some embodiments, the dielectric barrier DB formed over the RDL structure 26 is sleeved on the first portion CT1 and extends to cover at least a part of the second portion CT2. For example, the first portion CT1 of the conductive contact CT is laterally encapsulated by the dielectric barrier DB, the bottom sidewall $CT2_B$ of the second portion CT2 (e.g., the part connected to the first portion CT1) is laterally covered by the dielectric barrier DB, and the top sidewall $CT2_T$ of the second portion CT2 (e.g., the part opposite to the bottom sidewall $CT2_B$) is accessibly revealed by the dielectric barrier DB. Owing to an increased risk that conductive contacts CT adjacent to one other may unintentionally make contact and bridge during the reflow process, the dielectric barrier DB may serve as a spacer disposed on the sidewalls of the conductive contacts CT so as to eliminate the bridging and undesired short circuit issues. The detailed description will be discussed later accompany with other embodiments herein. In some embodiments, the dielectric barrier DB is a dielectric layer which is free of any particulate filler material. For example, the dielectric barrier DB may be substantially particulate free polymeric material including epoxy, polyimide, polybenzoxazole, polyamine, polynitrile, polyacrylate, and/or the like.

In some embodiments, a maximum height $H_{DB}$ of the dielectric barrier DB is less than a maximum height $H_{CT}$ (e.g., the total height of the first portion CT1 and the corresponding second portion CT2) of the conductive contact CT. In some embodiments, the dielectric barrier DB has a curvilinear top surface Sc surrounding the conductive contact CT and extending along a first direction D1 (e.g., a thickness direction of the dielectric barrier DB or a width direction of the semiconductor device SD1). The maximum height $H_{DB}$ may be a shortest vertical distance measured from a surface BS1 of the dielectric barrier DB (e.g., the surface in direct contact with the RDL structure 26) along a second direction D2 to a first reference plane PL1 (e.g., the plane where a boundary BS2 of the dielectric barrier DB is located). The boundary BS2 of the dielectric barrier DB may be in direct contact with the second portion CT2 of the conductive contact CT and divided the second portion CT2 into two regions (e.g., a region masked by the dielectric barrier DB and a region unmasked by the dielectric barrier DB). The second direction D2 may be perpendicular to the first direction D1. For example, the second direction D2 is a height direction of the dielectric barrier DB or a height direction of the conductive contact CT, or a thickness direction of the semiconductor device SD1. The maximum height $H_{CT}$ may be a shortest vertical distance measured from a surface FS1 of the first portion CT1 in contact with the RDL structure 26 along the second direction D2 to a surface FS2 of the second portion CT2 in physical contact with the circuit carrier 13 of the first package component PC1.

In some embodiments, a thickness $T_{DB}$ of the dielectric barrier DB decreases from the first portion CT1 of the conductive contact CT to the second portion CT2 of the conductive contact CT. For example, a maximum thickness of the dielectric barrier DB covering on the second portion CT2 of the conductive contact CT is less than about 3 μm. In some embodiments, a maximum diameter $D_{CT2}$ of the second portion CT2 is greater than a maximum diameter $D_{CT1}$ of the first portion CT1. In some embodiments, the boundary BS2 of the dielectric barrier DB on the second portion CT2 ends between an interface plane PL0 (e.g., where the interface between the first portion CT1 and the second portion CT2 is located) and a second reference plane PL2 (e.g., where the maximum diameter $D_{CT2}$ of the second portion CT2 is located). In some embodiments, the boundary BS2 of the dielectric barrier DB may be located on the second reference plane PL2. In alternative embodiments, the dielectric barrier DB may travel up the sidewall of the second portion CT2 so that the boundary BS2 of the dielectric barrier DB may end at the point close to an interface between the first package component PC1 and the second portion CT2. For example, a surface area of the second portion CT2 covered by the dielectric barrier DB is at least about 5% of a total surface area of the second portion CT2 of the conductive contact CT. In some embodiments, the size of the external terminals 14 may be at least ten times or a hundred times greater than the size of the conductive contacts CT. It should be noted that the dimension (e.g., thickness, height, etc.) of the dielectric barrier DB may be adjusted according to the characteristics and the amount of the applied material as well as the dimension and the material of the conductive contacts CT.

In some embodiments, the semiconductor device SD1 includes an underfill layer UF interposed between the first package component PC1 and the second package component PC2. For example, the conductive contacts CT and the dielectric barrier DB are covered by the underfill layer UF, thereby enhancing the reliability of the semiconductor device SD1. In some embodiments, the part (e.g., the first portion CT1 and the bottom sidewall $CT2_B$ of the second portion CT2) of the conductive contact CT is physically spaced apart from the underfill layer UF via the dielectric barrier DB. The top sidewall $CT2_T$ of the second portion CT2 which is unmasked by the dielectric barrier DB may be in physical contact with the underfill layer UF. In alternative embodiments, the dielectric barrier DB covers the sidewalls of the first portion CT1 and the second portion CT2, so that the underfill layer UF is not in physical contact with the conductive contact CT. The material of the dielectric barrier DB is different from the material of the underfill layer UF. For example, the underfill layer UF includes a liquid epoxy, deformable gel, silicon rubber, or the like. The underfill layer UF may also include a polymer layer with filler materials FL (e.g., oxide, nitride, carbide, or the like) therein. It should be appreciated that the filler materials FL shown in the drawings are merely illustrative examples. In some embodiments, the filler materials FL are added to lower the coefficient of thermal expansion (CTE) of the polymer layer of the underfill layer UF. In some embodiments, the underfill layer UF contains the filler materials FL therein, whilst the dielectric barrier DB is free of fillers. Due to the presence of the filler materials FL, the underfill layer UF may have a higher viscosity than the dielectric barrier DB. The semiconductor device SD1 may be mounted on an electronic component (not shown; e.g., a package, a packaging substrate, a mother board, a system board, or the like) to form an electronic device.

Figure 2A:
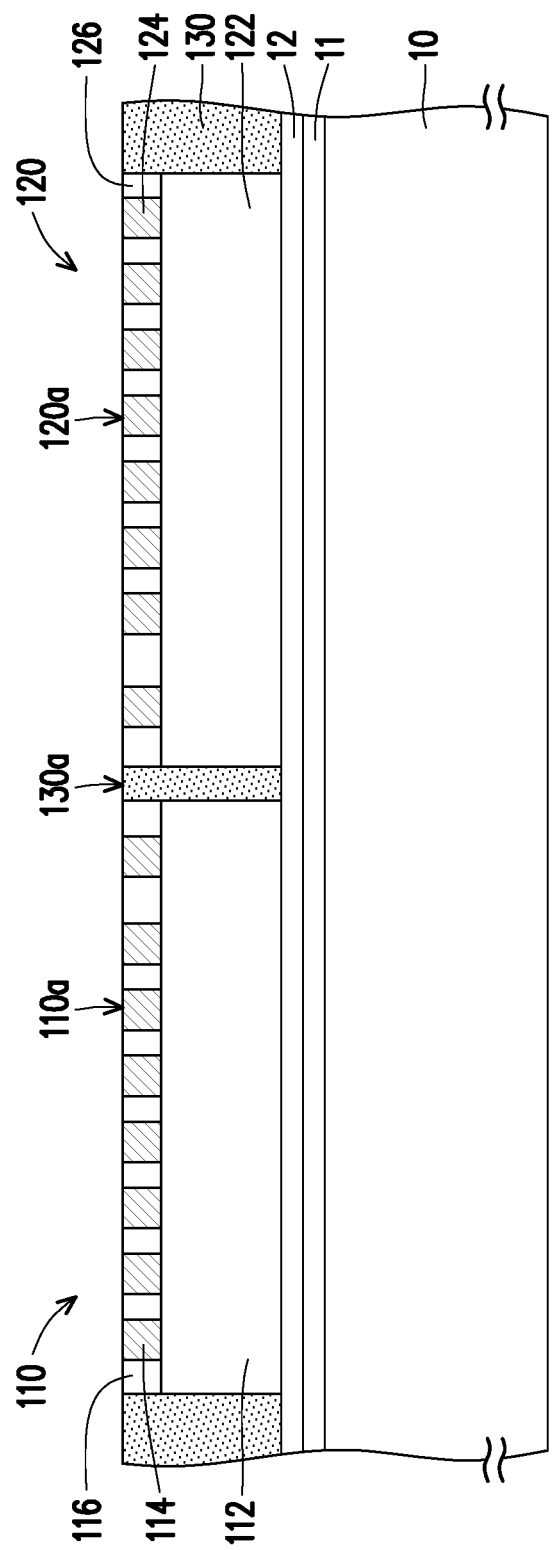

FIG. 2A to FIG. 2J are schematic cross-sectional views of various stages of manufacturing a semiconductor package in accordance with some exemplary embodiments of the disclosure. Referring to FIG. 2A, a plurality of semiconductor dies are disposed on a temporary carrier 10. For example, after performing a singulation process to separate individual semiconductor dies from a semiconductor wafer (not shown), a first die 110 and a second die 120 are picked and placed on the temporary carrier 10. After the first die 110 and the second die 120 are disposed side by side on the temporary carrier 10, a gap is formed between the first die 110 and the second die 120. In some embodiments, the first die 110 and the second die 120 are attached onto the temporary carrier 10 through an adhesive layer 12. The temporary carrier 10 may be a glass carrier, a ceramic carrier, a metal carrier, or the like. The adhesive layer 12 may be a die attach film (DAF) or other suitable bonding layer. In some embodiments, the first die 110 and the second die 120 are disposed on the temporary carrier 10 through a de-bonding layer 11. The de-bonding layer 11 is formed on the temporary carrier 10 by, for example, a spin coating process or other suitable deposition method. In some embodiments, the de-bonding layer 11 is formed of an adhesive such as Ultra-Violet (UV) glue, Light-to-Heat Conversion (LTHC) glue, or other types of adhesives. In some embodiments, the de-bonding layer 11 is decomposable under the heat of light to release the temporary carrier 10 from the overlying structures that will be formed in subsequent steps.

The first die 110 may include a semiconductor substrate 112, die connectors 114 distributed on the semiconductor substrate 112, and a protection layer 116 disposed on the semiconductor substrate 112 and covering the die connectors 114 for protection. In some embodiments, the second die 120 includes a similar or the same structure as the first die 110. For example, the second die 120 includes a semiconductor substrate 122, die connectors 124 distributed on the semiconductor substrate 122, and a protection layer 126 disposed on the semiconductor substrate 122 and covering the die connectors 124 for protection. In some embodiments, the die connectors 114/124 include conductive pillars/vias/bumps/posts made of such as solder, gold, copper, or other suitable conductive materials. The die connectors 114/124 may be formed by an electroplating process or other suitable deposition process. The surface where the die connectors 112 are distributed may be referred to as the active surface 110a of the first die 110 for further electrical connection. The active surface 120a of the second die 120 faces the same direction as the active surface 110a of the first die 110. In some embodiments, a material of the protection layer 116/126 includes polybenzoxazole, polyimide, a suitable organic or inorganic material, or the like.

The first die 110 and the second die 120 may be the same type of semiconductor dies or the different types of semiconductor dies. In some embodiments, the first die 110 and/or the second die 120 may include active components (e.g., transistors or the like) and, optionally, passive components (e.g., resistors, capacitors, inductors, etc.) formed on the semiconductor substrate 112/122. The first die 110 and/or the second die 120 may be or may include a logic die, such as a central processing unit (CPU) die, a graphic processing unit (GPU) die, a micro control unit (MCU) die, an input-output (I/O) die, a baseband (BB) die, or an application processor (AP) die. In some embodiments, at least one of the first die 110 and the second die 120 includes a memory die such as high bandwidth memory (HBM) die. It should be appreciated that the number of the dies and the function of the dies to be packaged may depend on the design requirements.

Continue to FIG. 2A, a first encapsulant 130 is formed over the temporary carrier 10 to encapsulate the first die 110 and the second die 120. The first encapsulant 130 includes a molding compound (e.g., epoxy resins), a dielectric material such as polybenzoxazole, polyimide, benzocyclobutene, a combination thereof, or other suitable electrically insulating materials. In some embodiments, the method of forming the first encapsulant 130 includes at least the following steps. An insulating material (not shown) is formed on the temporary carrier 10, so that the first die 110 and the second die 120 are over-molded, and the gap between the first die 110 and the second die 120 is filled. Next, a thinning process is performed on the insulating material to reduce the thickness of the insulating material until at least a portion of the die connectors 114 of the first die 110 and at least a portion of the die connectors 126 of the second die 120 are accessibly revealed. The thinning process may include a grinding process, a chemical mechanical polishing (CMP) process, and/or a planarization process, or other suitable removing process. A cleaning step is optionally performed after thinning to clean and remove the residues generated from the thinning process. After reducing the thickness of the insulating material, the first encapsulant 130 is formed. However, the formation of the first encapsulant 130 may be performed through any other suitable techniques, which is not limited thereto. In some embodiments, during the thinning process, the protection layer 116 and/or the die connectors 114 of the first die 110 and the protection layer 126 and/or the die connectors 124 of the second die 120 may be slightly removed and planarized. The die connectors 114 of the first die 110 and the die connectors 124 of the second die 120 may be accessibly revealed by the protection layer 116 and 126, respectively. The protection layer 116 of the first die 110 may at least laterally cover the die connectors 114. Similarly, the protection layer 126 of the second die 120 may at least laterally cover the die connectors 124. In some embodiments, after forming the first encapsulant 130, a top surface 130a of the first encapsulant 130 may be substantially coplanar with the active surface 110a of the first die 110 and the active surface 120a of the second die 120.

Figure 2B:
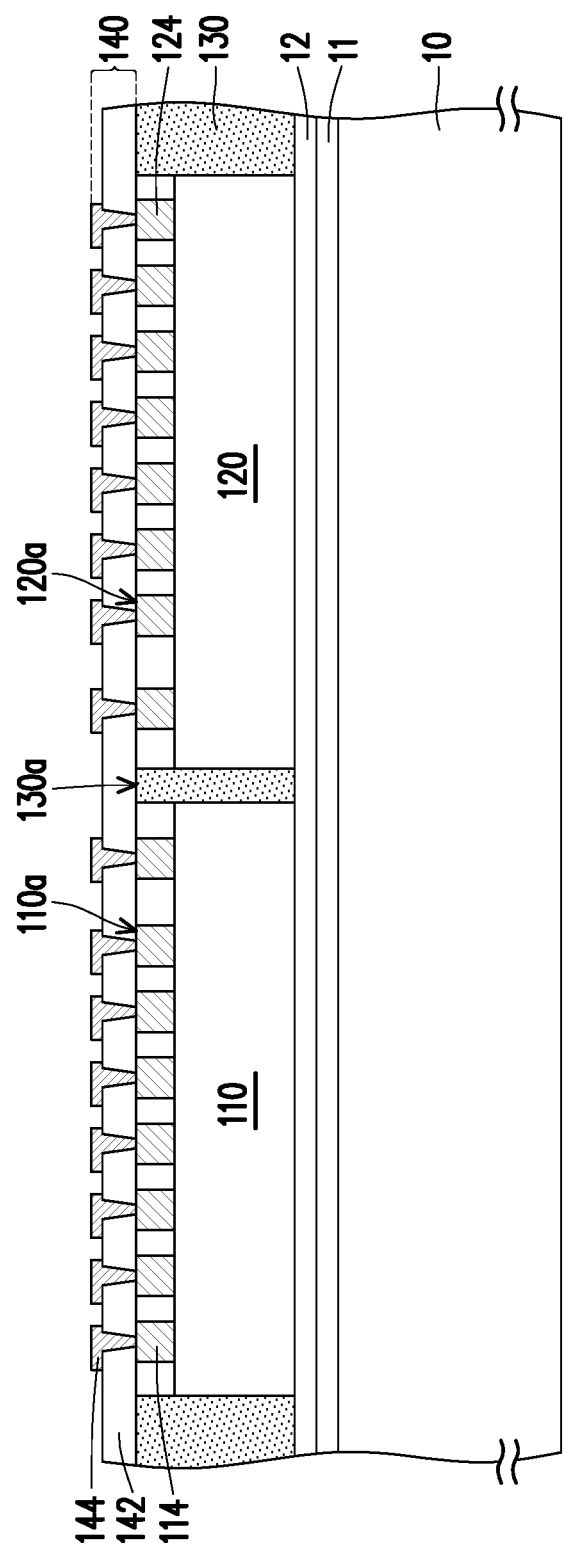

Referring to FIG. 2B, a redistribution layer 140 is formed on the top surface 130a of the first encapsulant 130, the active surface 110a of the first die 110, and the active surface 120a of the second die 120. For example, the redistribution layer 140 includes a first patterned dielectric layer 142 and a first patterned conductive layer 144. In some embodiments, the method of forming the redistribution layer 140 includes at least the following steps. A dielectric material (e.g., polybenzoxazole, polyimide, benzocyclobutene, or other suitable material that is electrically insulating) is formed over the top surface 130a of the first encapsulant 130, the active surface 110a of the first die 110, and the active surface 120a of the second die 120, using a spin-on process, a deposition process, or other suitable process. Next, a portion of the dielectric material is removed to form the first patterned dielectric layer 142 having a plurality of openings by lithography and etching or other suitable removing process. The openings of the first patterned dielectric layer 142 expose at least a portion of the die connectors 114 of the first die 110 and at least a portion of the die connectors 124 of the second die 120. Subsequently, a conductive material (e.g., a metal or a metal alloy such as copper, silver, gold, tungsten, cobalt, aluminum, or alloys thereof) is formed over the surface of the first patterned dielectric layer 142 and also formed inside the openings of the first patterned dielectric layer 142, and then the conductive material is patterned to form the first patterned conductive layer 144 through patterning and metallization techniques (e.g., deposition of seed layer, lithography, plating, etching, etc.). Other suitable techniques may be utilized to form the redistribution layer 140. The first patterned conductive layer 144 may include conductive lines, conductive vias, and conductive pads, etc. The first patterned conductive layer 144 may penetrate through the first patterned dielectric layer 142 so as to be in physical and electrical contact with the die connectors 114 of the first die 110 and the die connectors 124 of the second die 120. It is appreciated that the numbers of the patterned dielectric layers and the patterned conductive layers may depend on the circuit design and is not limited by the disclosure.

Figure 2C:
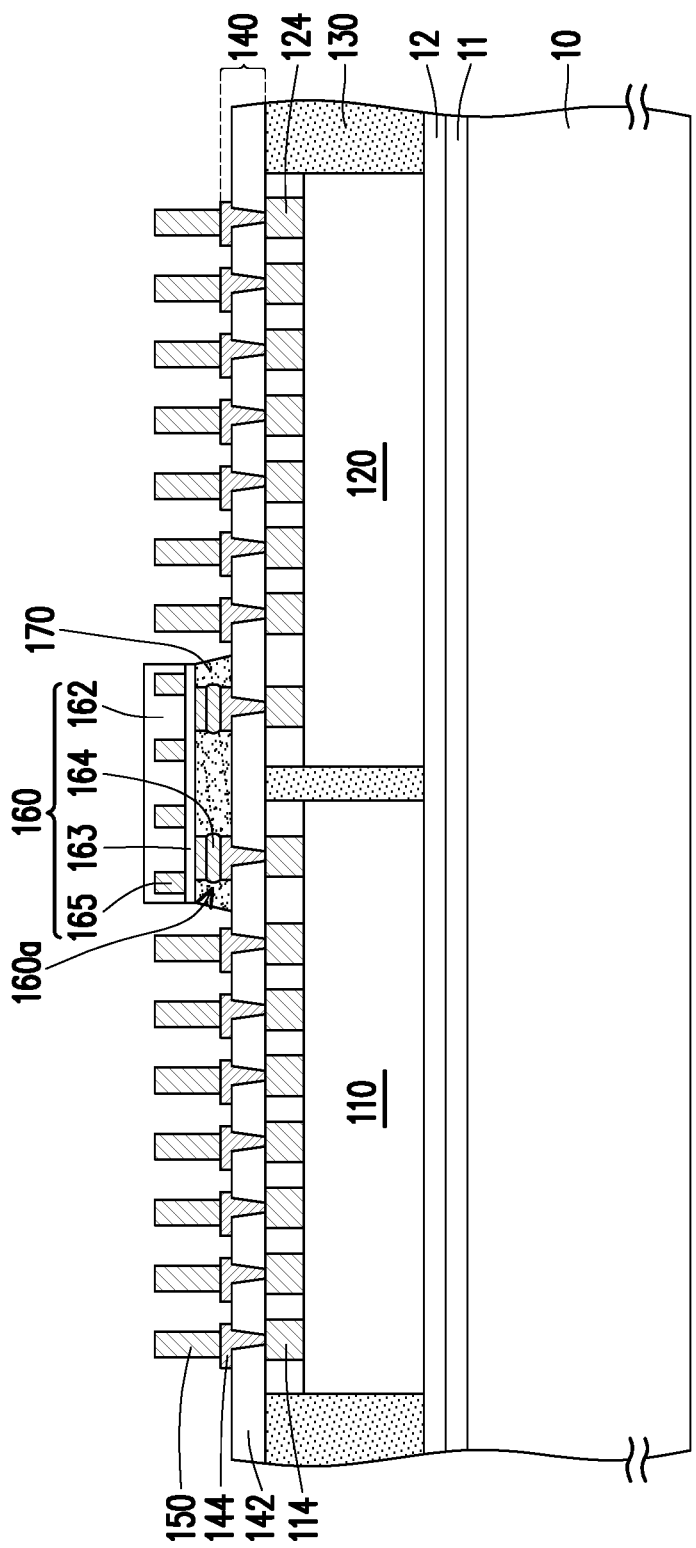

Referring to FIG. 2C, one or more conductive connectors 150 may be formed on the redistribution layer 140. A material of the conductive connectors 150 includes copper, nickel, solder, a combination thereof, or the like. In some embodiments, the method of forming the conductive connectors 150 includes the following steps. A photoresist layer with openings (not shown) is formed on the redistribution layer 140, and the openings of the photoresist layer may expose the intended locations of the first patterned conductive layer 144 for the subsequently formed conductive connectors 150. Subsequently, a plating process or other suitable deposition process is performed to form a metallic layer (e.g., a copper-containing layer) in the openings of the photoresist layer, and then the photoresist layer is removed. The conductive connectors 150 are remained on the first patterned conductive layer 144 of the redistribution layer 140. The conductive connectors 150 may be electrically coupled to the first die 110 and the second die 120 through the redistribution layer 140. It is appreciated that the number and the location of the conductive connectors 150 are variable and can be modified in demand.

Continue to FIG. 2C, a third die 160 is disposed on the redistribution layer 140. For example, after forming the conductive connectors 150, the third die 160 is picked and placed on the redistribution layer 140. In some embodiments, the third die 160 is surrounded by the conductive connectors 150. The third die 160 may be the same type or the different types of semiconductor dies with respective to the first die 110 and/or the second die 120. In some embodiments, the third die 160 includes a semiconductor substrate 162, a device layer 163 disposed on the semiconductor substrate 162, and die connectors 164 connected to the device layer 163. The device layer 163 may include a wide variety of IC devices (not shown; such as active devices (e.g., diodes, transistors, optoelectronic devices, etc.), and/or passive devices (e.g., resistors, capacitors, inductors, etc.)) formed on the semiconductor substrate 162. The side where the die connectors 164 are distributed may be referred to as the front side 160a of the third die 160. The third die 160 may be disposed in a flip-chip manner. For example, after disposing the third die 160, the front side 160a of the third die 160 is connected to the first patterned conductive layer 144 and faces toward the active surface 110a of the first die 110 and the active surface 120a of the second die 120. In some embodiments, the third die 130 includes through semiconductor vias (TSVs) 165. The TSVs 165 penetrate through the semiconductor substrate 162 so as to be in electrical contact with the device layer 163. In some embodiments, the third die 160 is a bridge structure (e.g., a silicon bridge) for a shorter electrical connection path between the first die 110 and the second dies 120. For example, the third die 160 includes an interconnecting structure, and frees from active and/or passive device(s). The device layer 163 may be omitted when the third die 160 is provided to be used as the bridge structure. In alternative embodiments, the third die 160 includes an interconnecting structure, active devices, and optionally, passive devices.

Still referring to FIG. 2C, an underfill 170 is optionally formed between the third die 160 and the redistribution layer 140. For example, a liquid organic material (e.g., epoxy mixture) is initially dispensed into the gap between third die 160 and the redistribution layer 140, and then the curing process is performed to harden the liquid organic material so as to form the underfill 170. The underfill 170 may cover the die connectors 164 of the third die 160 and the first patterned conductive layer 144 of the redistribution layer 140, thereby strengthening the attachment and helping to prevent the thermal stresses from breaking the connection therebetween. In some embodiments, a portion of the underfill 170 travels up to cover the sidewalls of the third die 170. In other embodiments, the third die 160 is disposed prior to the step of forming the conductive connectors 150. Alternatively, the conductive connectors 150 are omitted.

Figure 2D:
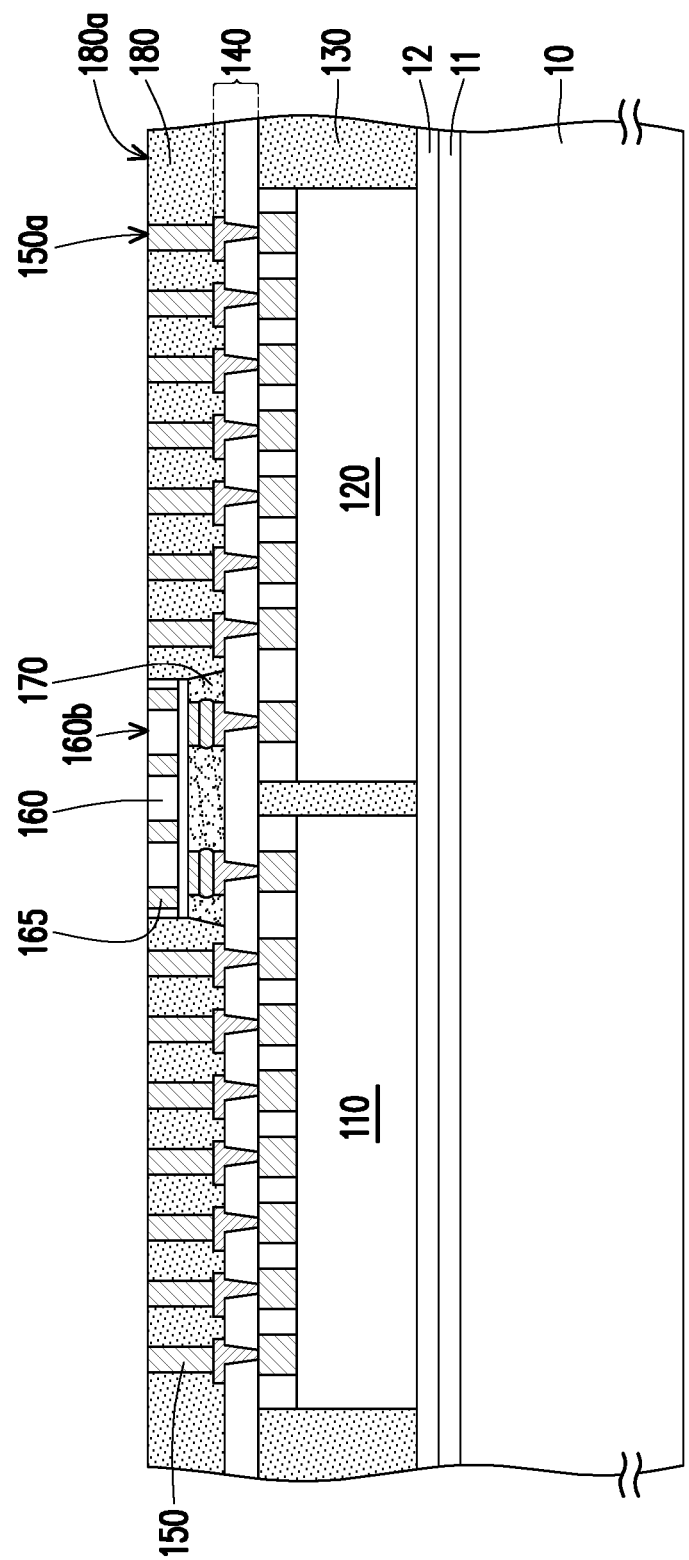

Referring to FIG. 2D, a second encapsulant 180 is formed on the redistribution layer 140 to encapsulate the conductive connectors 150, the third die 160, and the underfill 170. The forming process and the material of the second encapsulant 180 may be similar to that of the first encapsulant 130, and thus, details thereof are simplified for brevity. In some embodiments, the conductive connectors 150, the third die 160, and the underfill 170 are initially over-molded by an insulating material. Next, a thinning process is performed to reduce the thickness of the insulating material until at least a portion of the conductive connectors 150 is exposed so as to form the second encapsulant 180. In some embodiments, during the thinning process, the conductive connectors 150 and/or the third die 160 are slightly removed. In certain embodiments, the third die 160 is grinded until the TSVs 165 are exposed. After forming the second encapsulant 180, a top surface 180a of the second encapsulant 180 may be substantially coplanar with a rear side 160b (e.g., opposite to the front side 160a) of the third die 160 and the top surfaces 150a of the conductive connectors 150. In some embodiments, the structure including the first die 110, the second die 120, the redistribution layer 140, the conductive connectors 150, and the third die 160 may be collectively viewed as the IC component structure. The first encapsulant 130 and the second encapsulant 180 may be collectively viewed as the insulating encapsulation which laterally encapsulates the IC component structure.

In alternative embodiments, the second encapsulant 180 is formed prior to the formation of the conductive connectors 150. For example, after disposing the third die 160, the second encapsulant 180 is formed on the redistribution layer 140 to wrap the third die 160. Subsequently, portions of the second encapsulant 180 may be removed to form through holes exposing the intended locations of the redistribution layer 140. Afterwards, a conductive material may be formed in the through holes of the second encapsulant 180 so as to form the conductive connectors 150. A planarizing process is optionally performed on the second encapsulant 180 and/or the conductive connectors 150 and/or the third die 160 to render a substantially flat surface.

Figure 2E:
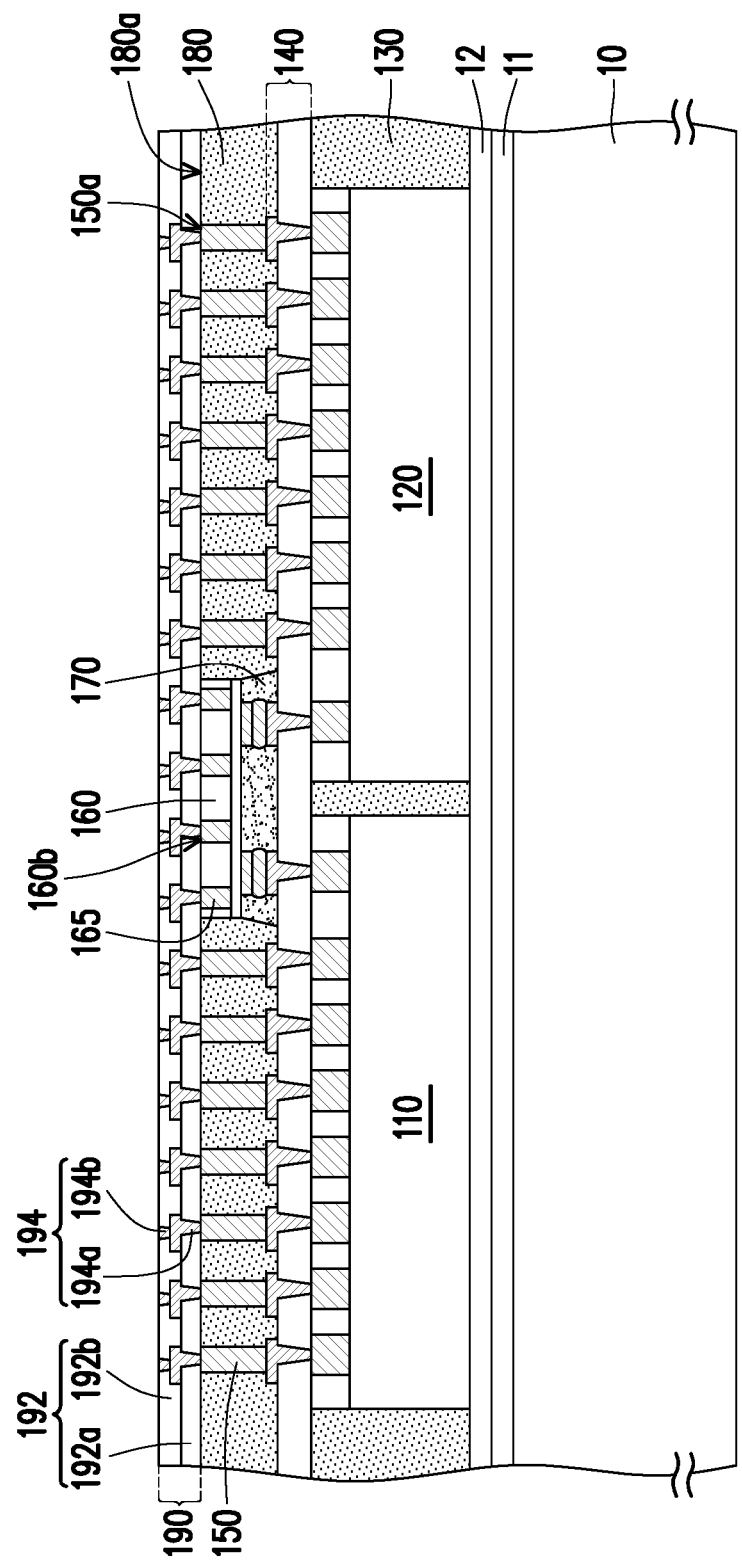

Referring to FIG. 2E, a redistribution structure 190 is formed on the top surface 180a of the second encapsulant 180, the rear side 160b of the third die 160, and the top surfaces 150a of the conductive connectors 150. The redistribution structure 190 is in physical and electrical contact with the conductive connectors 150. In certain embodiments, the redistribution structure 190 is in physical and electrical contact with the TSVs 165 of the third die 160. The redistribution structure 190 may include a second patterned dielectric layer 192 and a second patterned conductive layer 194. In some embodiments, a plurality of polymer sublayers (e.g., 192a, 192b) and a plurality of metallic sublayers (e.g., 194a, 194b) are stacked alternately to form the redistribution structure 190. The numbers of the polymer sublayers and the metallic sublayers are not limited in the disclosure. In some embodiments, the polymer sublayers 192a and 192b are made of the same material, and the polymer sublayers 192a and 192b may be collectively viewed as the second patterned dielectric layer 192. The metallic sublayers 194a and 194b may be collectively viewed as the second patterned conductive layer 194.

The forming process and the material of the redistribution structure 190 may be similar to that of the redistribution layer 140, and thus, details thereof are simplified for brevity. For example, first, the polymer sublayer 192a having a plurality of openings is formed over the top surface 180a of the second encapsulant 180, the rear side 160b of the third die 160, and the top surfaces 150a of the conductive connectors 150. The openings of the polymer sublayer 192a may expose at least a portion of the conductive connectors 150 and/or at least a portion of the TSVs 165 of the third die 160. Next, a conductive material is formed and patterned to form the metallic sublayer 194a on the surface of the polymer sublayer 192a and inside the openings of the polymer sublayer 192a so as to be in physical and electrical contact with the conductive connectors 150 and/or the TSVs 165 of the third die 160. Subsequently, the polymer sublayer 192b is formed on the polymer sublayer 192a to cover the metallic sublayer 194a. The polymer sublayer 192b may have a plurality of openings exposing at least a portion of the metallic sublayer 194a. Afterwards, the metallic sublayer 194b is formed and patterned on the polymer sublayer 192b and inside the openings of the polymer sublayer 192b so as to be in physical and electrical contact with the underlying metallic sublayer 194a. In some embodiments, the metallic sublayer 194b includes connecting pads or under-ball metallurgy (UBM) pattern (not shown) for further electrical connection. It is appreciated that the numbers of the polymer sublayers and the metallic sublayers may depend on the circuit design, which are not limited in the disclosure.

Figure 2F:
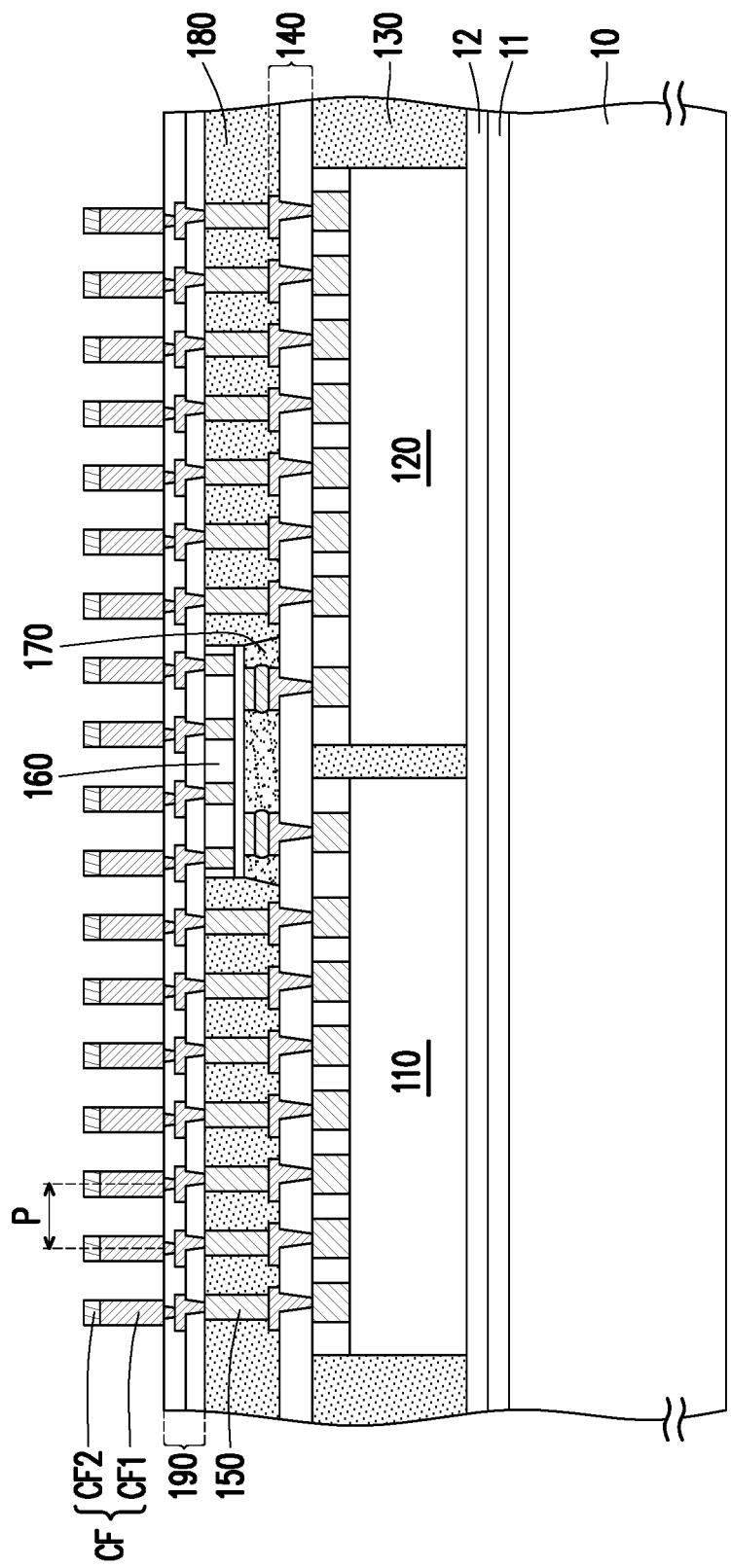

Referring to FIG. 2F, a plurality of conductive features CF are formed on the redistribution structure 190. For example, each conductive feature CF includes a first portion CF1 and a second portion CF2. The first portion CF1 is formed on the metallic sublayer 194b of the redistribution structure 190, and the second portion CF2 is formed on the first portions CF1. In some embodiments, the first portion CF1 and the second portion CF2 are made of different materials. For example, the first portion CF1 is substantially a conductive material layer including pure elemental copper, copper containing unavoidable impurities, or copper alloys containing minor amounts of elements such as tantalum, indium, tin, zinc, titanium, germanium, platinum, aluminum, etc. The second portion CF2 may include solder material including alloys of tin, lead, silver, copper, nickel, bismuth, or combinations thereof. In some embodiments, the conductive feature CF includes a plurality bumps arranged in an array.

In some embodiments, the method of forming the conductive features CF includes at least the following steps. A mask layer (not shown) having a plurality of openings is initially formed on the polymer sublayer 192b of the redistribution structure 190. The openings of the mask layer may expose the intended locations of the metallic sublayer 194b of the redistribution structure 190 for the subsequently formed conductive features CF. Next, a plating process or other suitable deposition process may be performed in the openings of the mask layer to form the first portions CF1 being in physical and electrical contact with the metallic sublayer 194b. Subsequently, a solder material may be formed in the openings of the mask layer to form the second portions CF2 being in physical and electrical contact with respective ones of the underlying first portions CF1 using suitable methods (e.g., evaporation, electroplating, printing, solder transfer, ball placement, etc.). Afterwards, the mask layer is removed, and the conductive features CF are remained on the metallic sublayer 194b of the redistribution structure 190. In alternative embodiments, the first portions CF1 of the conductive features CF are formed during the same process of depositing the metallic sublayer 194b. In some embodiments, the array of the conductive features CF is formed in a fine-pitched arrangement so as to enable high-density electrical connection. In some embodiments, a pitch P between the most adjacent conductive features CF is less than about 100 µm. For example, the pitch P between the most adjacent conductive features CF is in a range between about 30 µm and about 100 µm. It is appreciated that the values recited throughout the description are merely examples, and may be changed to different values.

Figure 2G:
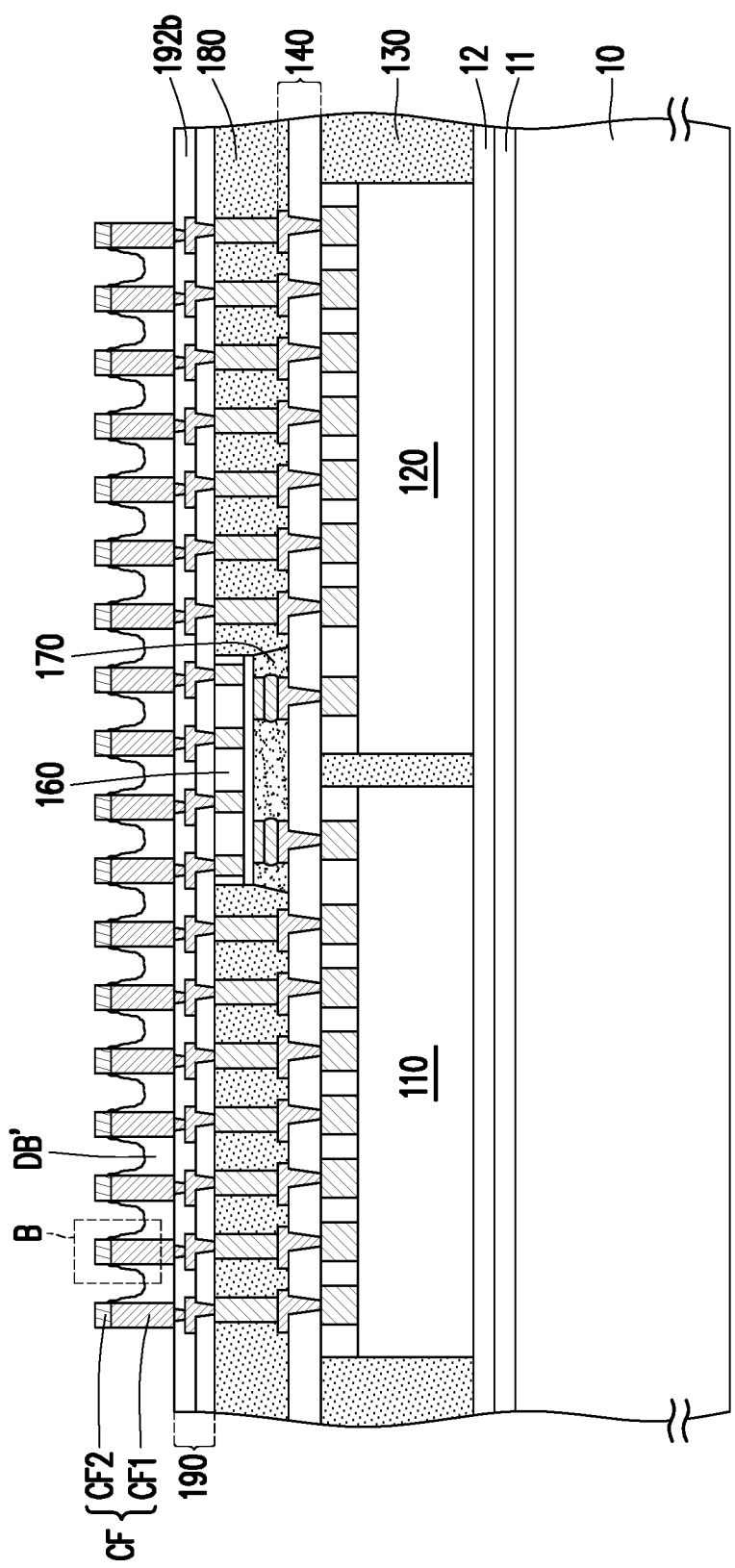
Figure 3:
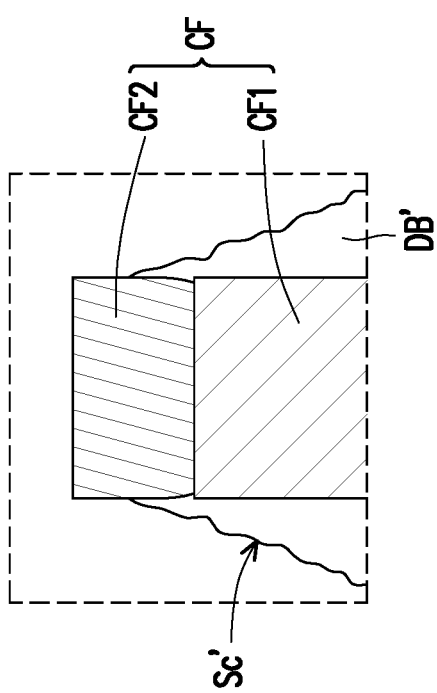
FIG. 3 is a schematic, enlarged cross-sectional view of the dashed area B outlined in FIG. 2G in accordance with some exemplary embodiments of the disclosure.

FIG. 3 is a schematic, enlarged cross-sectional view of the dashed area B outlined in FIG. 2G in accordance with some exemplary embodiments of the disclosure. Referring to FIG. 2G and FIG. 3, a dielectric material DB' is formed on the redistribution structure 190 to surround the first portions CF1 of the conductive features CF and extend between respective ones of the second portions CF2 of the conductive features CF. For example, the dielectric material DB' covers the first portions CF1 and climb upwardly to cover at least a part of the corresponding second portions CF2. The free ends of the second portions CF2 may be exposed by the dielectric material DB' for allowing further electrical connection. The dielectric material DB' may be substantially filler-free polymeric material including epoxy, polyimide, polybenzoxazole, polyamine, polynitrile, polyacrylate, and/or the like. In some embodiments, an appropriate amount of the dielectric material DB' is dispensed on the polymer sublayer 192b of the redistribution structure 190 and drawn upwardly between two of the most adjacent conductive features CF. The dielectric material DB' may be in semi-liquid form having a lower viscosity at the time when it is dispensed.

Figure 2H:
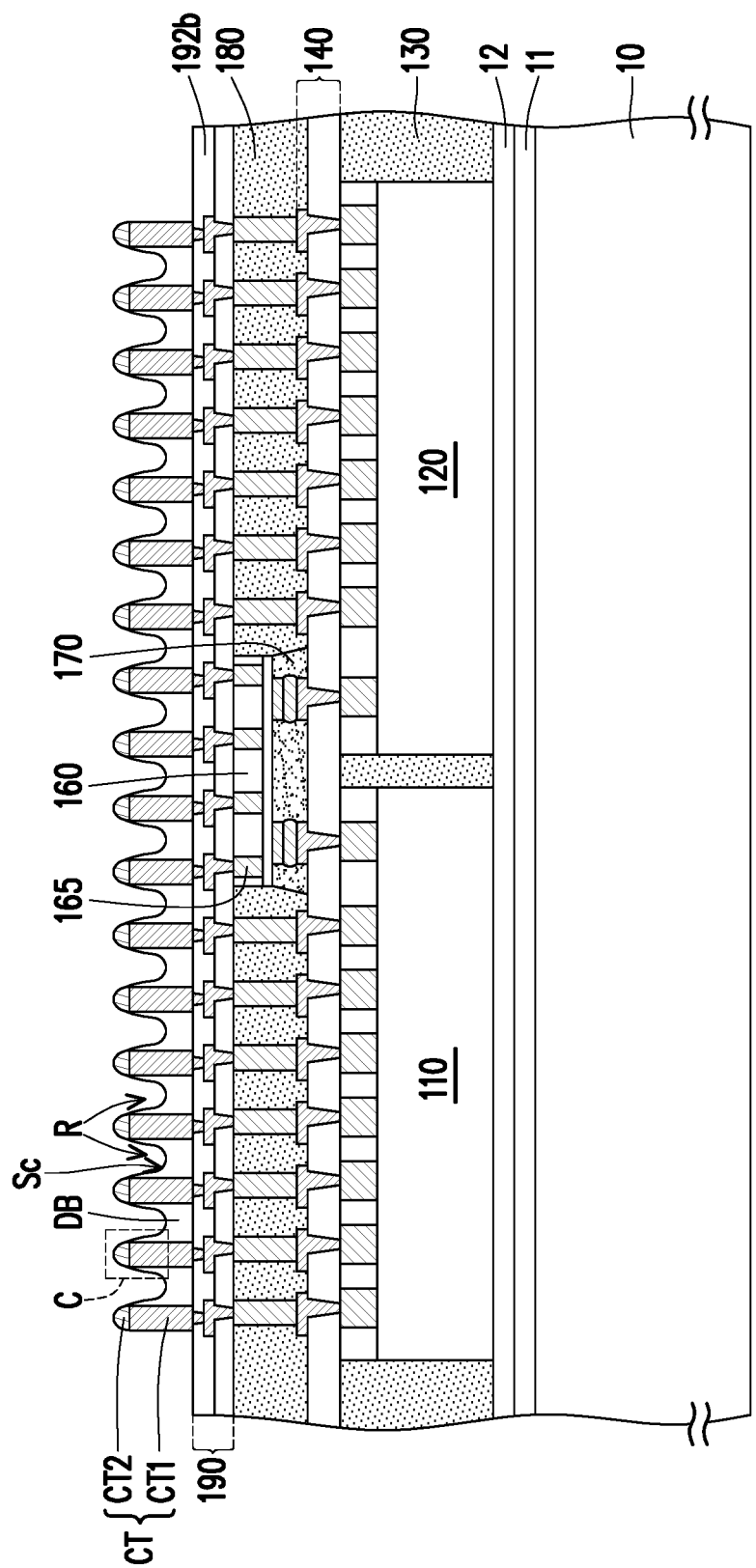
Figure 21:
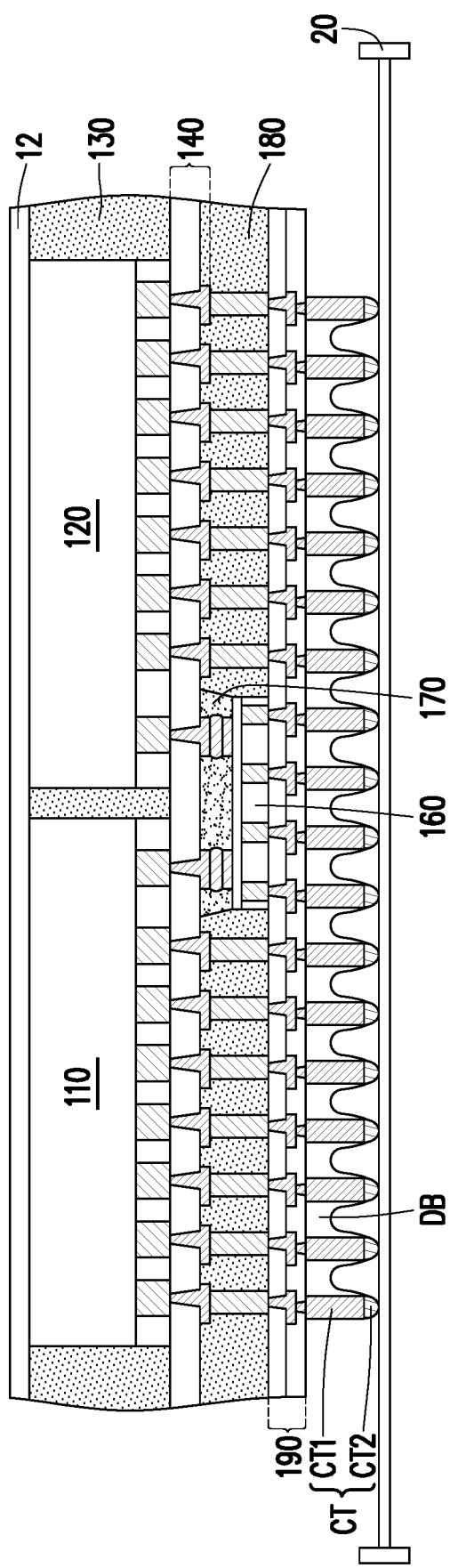
Figure 4:
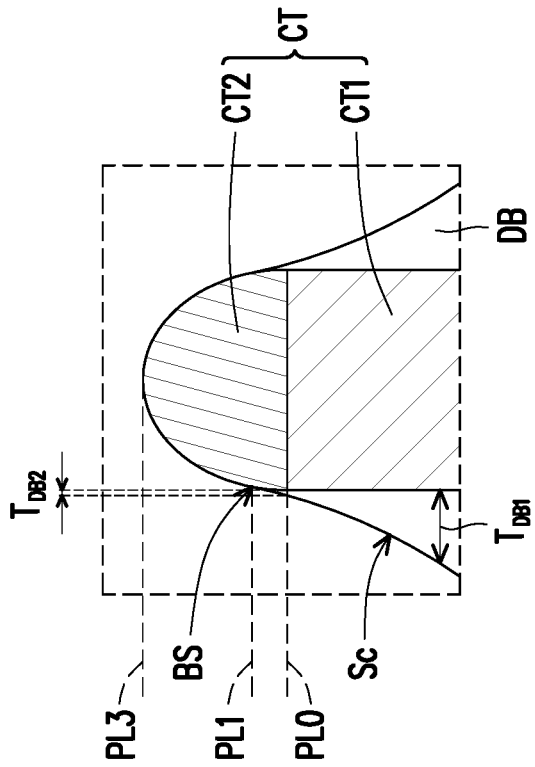
FIG. 4 is a schematic, enlarged cross-sectional view of the dashed area C outlined in FIG. 2H in accordance with some exemplary embodiments of the disclosure.

FIG. 4 is a schematic, enlarged cross-sectional view of the dashed area C outlined in FIG. 2H in accordance with some exemplary embodiments of the disclosure. Referring to FIG. 2H and FIG. 4, the conductive features CF and the dielectric material DB' are reshaped to form a plurality of conductive contacts CT and a dielectric barrier DB, respectively. As shown in FIG. 2H, the most adjacent ones of the conductive contacts CT are spaced apart by the dielectric barrier DB. In some embodiments, during the reshaping step, the conductive features CF are subjected to an elevated temperature. For example, the elevated temperature may cause the melting of the second portions CF2, and thus the second portions CF2 of the conductive features CF are reflowed. The first portions CF1 of the conductive features CF may not be deformed or may be slightly deformed during the reshaping step. In certain embodiments in which the second portions CF2 are made of solder-containing material, the reshaping process (i.e. reflow) may be performed to deform the second portions CF2 into desired shapes. For example, after reshaping, each of the second portions CT2 of the conductive contacts CT is reshaped into a hemispherical shape. Alternatively, the second portions CT2 of the conductive contacts CT may be formed as other shapes. The deformed shape of the second portions CT2 may be defined by surface tension during the reshaping process.

During the reshaping step, the dielectric material DB' may be cured to dry out the volatile compounds (e.g., moisture or other organic compounds) with low evaporation temperature so as to form the dielectric barrier DB. Any suitable light source (e.g., a radiation which may provide the light having a UV wavelength) or other appropriate heating methods may be utilized. In some embodiments, the reshaping process (i.e. curing) may be performed on the dielectric material DB' at a temperature of between about 80° C. and 150° C. for a time of between about 30 minutes and about 60 minutes. However, any suitable temperature and duration may be employed during the reshaping step. The dielectric barrier DB may be in solid form having a higher viscosity at the time when it is cured. The curing process helps set the shape or profile of the dielectric barrier DB. In some embodiment, after reshaping, the dielectric barrier DB has top surfaces Sc extending between respective ones of the conductive contacts CT, with center portions of the top surfaces Sc recessed from the corresponding edge portions (e.g., on opposite sides of respective ones of the center portions) of the top surface Sc to form a plurality of recesses R. That is, the dielectric barrier DB has a recessed top surfaces profile between two of the most adjacent conductive contacts CT. The diameter and the slope of each recess R may change along the height direction of the dielectric barrier DB. In some embodiments, the top surfaces Sc of the dielectric barrier DB are curvilinear. In some embodiments, the dielectric barrier DB has the smoother top surfaces Sc as compared to the top surfaces Sc' of the dielectric material DB' before curing as shown in FIG. 3 and FIG. 4. In some embodiments, the conductive contacts CT are arranged in an array and the top surface Sc of the dielectric barrier DB forms a substantially catenary (or dished) shape between two of the most adjacent conductive contacts CT in a cross-sectional plane.

In some embodiments, a thickness of the dielectric barrier DB decreases from respective ones of the first portions CT1 of the conductive contacts CT to the corresponding second portions CT2 of the conductive contacts CT. For example, a thickness $T_{DB1}$ of the dielectric barrier DB covering on the sidewalls of the first portions CT1 of the conductive contacts CT is greater than a thickness $T_{DB2}$ of the dielectric barrier DB covering on the sidewalls of the second portions CT2 of the conductive contacts CT. In some embodiments, a maximum thickness $T_{DB2}$ of the dielectric barrier DB on respective ones of the second portions CT2 of the conductive contacts CT is less than about 3 µm. As shown in FIG. 2H, the height of the dielectric barrier DB is smallest at about a midway point between the most adjacent conductive contacts CT and largest at the sidewall of the second portions CT2 of the conductive contacts CT. In some embodiments, the boundary BS2 of the dielectric barrier DB on respective ones of the second portions CT2 is located on the first reference plane PL1 which is between the interface plane PL0 (e.g., where the interface between the first portion CT1 and the second portion CT2 is located) and a third reference plane PL3 (e.g., where the top surfaces of the second portions CT2 are located). In some embodiments, a surface area of one of the second portions CT2 coated by the dielectric barrier DB is at least about 5% of a total surface area of the one of second portions CT2. For example, the dielectric barrier DB covers about 3% to 5% of the total surface area of one of the second portions CT2. If a sufficient amount of the dielectric material DB' is applied, a greater proportion of total surface area of one of second portions CT2 may be coated with the dielectric barrier DB. At least the tops of the second portions CT2 of the conductive contacts CT are unmasked by the dielectric barrier DB for allowing further electrical connection.

If the dielectric material DB' is absent, when the reflow process is performed, those solder-containing materials (e.g. the second portions CF2 of the conductive features CF) may melt and merge together owing to the fine pitched arrangement, such that the bridging issue occurs. However, since the dielectric material DB' is formed between the most adjacent conductive features CF, when the reflow process is performed, the dielectric material DB' confines the conductive features CF and remains spacing apart the conductive features CF from one another until the completion of the reflow process, thereby preventing bridging between conductive features CF during the reflow process. The dielectric barrier DB may permit a fine pitched arrangement of the conductive contacts CT without bridging.

Figure 2J:
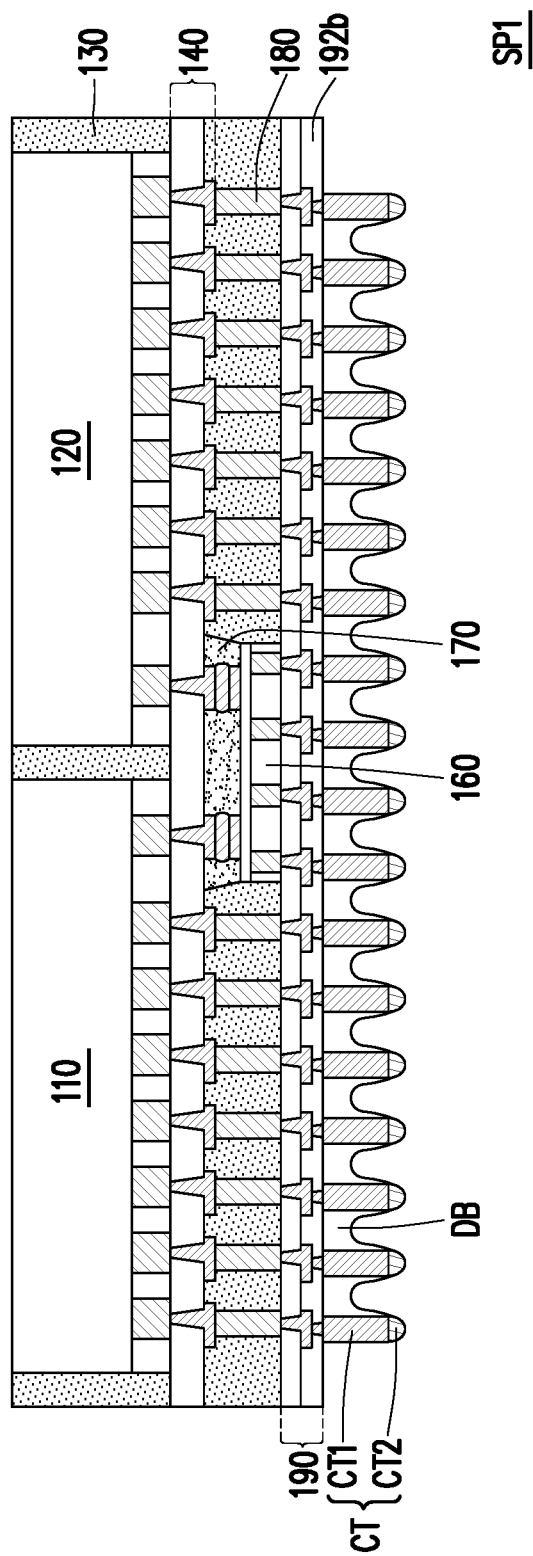

Referring to FIG. 2I and FIG. 2J, the temporary carrier 10 is detached and removed from the overlying structure. In some embodiments, the structure shown in FIG. 2H is overturned (e.g., turned upside down) to be placed on a holder 20 for the de-bonding process of the temporary carrier 10. For example, the de-bonding layer 11 (e.g., the LTHC release layer) is irradiated with a UV laser, so that the temporary carrier 10 and the de-bonding layer 11 are easily peeled off from the underlying structure. Nevertheless, the de-bonding process is not limited thereto, and other suitable de-bonding methods may be used in some alternative embodiments. In some embodiments, after removing the temporary carrier 10, the adhesive layer 12 (e.g., DAF) is left on the structure. In such embodiments, an additional removal process is performed to remove the adhesive layer 12. A cleaning step is optionally performed on the surface of the structure after the removal of the adhesive layer 12. In alternative embodiments, the adhesive layer 12 is removed along with the de-bonding layer 11 and the temporary carrier 10.

In some embodiments, the structure shown in FIG. 2I is singulated or separated at singulation lines (not shown) for forming individual semiconductor packages SP1 as illustrated in FIG. 2J. In some embodiments, the aforementioned steps are performed at wafer level and the singulation process may involve performing a wafer dicing process. For example, the dicing or singulation process is a laser cutting process, a mechanical cutting process, or other suitable process. To perform a singulation process, the holder 20 may be applied to the conductive contacts CT as shown in FIG. 2I. The holder 20 may be a dicing tape that supports the structure during the singulation process. In alternative embodiments, after forming the conductive contacts CT and the dielectric barrier DB, the singulation process may be performed to dice the structure illustrated in FIG. 2H along the singulation lines, and then the singulated structures are placed on the holder 20 for subsequent processes.

Figure 5A:
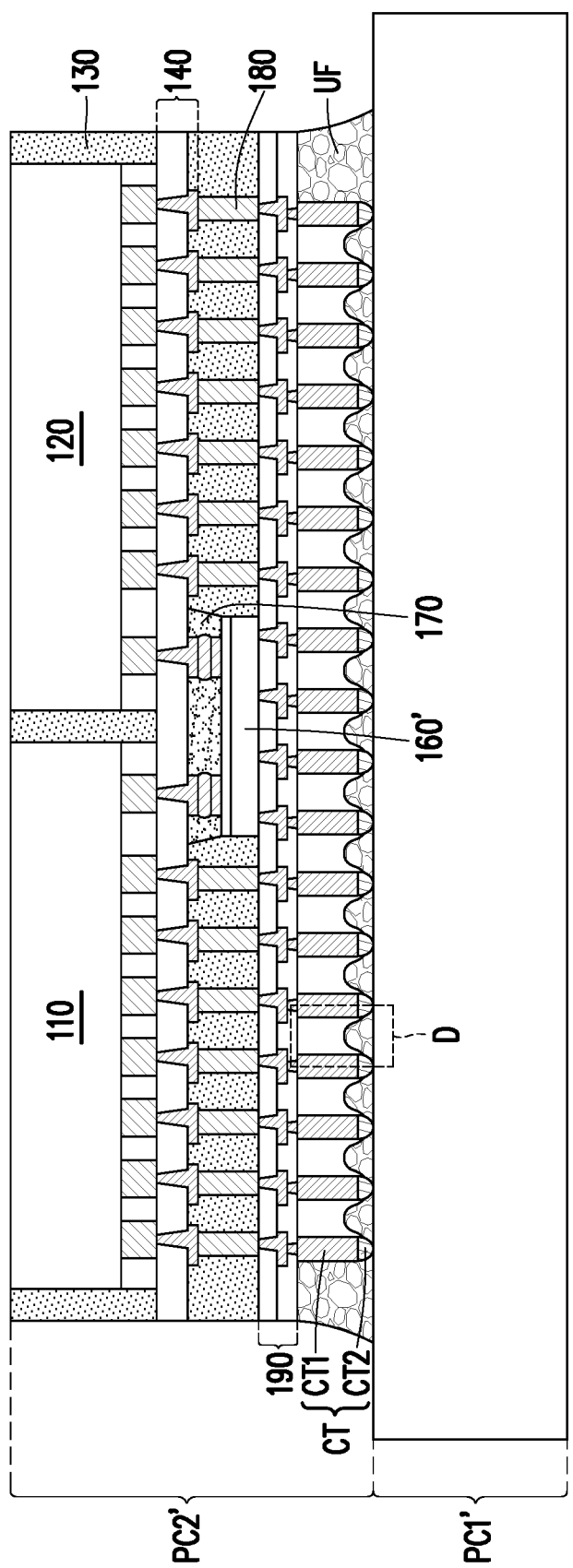
FIG. 5A is a schematic cross-sectional view illustrating a semiconductor device in accordance with some exemplary embodiments of the disclosure.

FIG. 5A is a schematic cross-sectional view illustrating a semiconductor device in accordance with some exemplary embodiments of the disclosure and FIG. 5B is a schematic, enlarged cross-sectional view of the dashed area D outlined in FIG. 5A in accordance with some exemplary embodiments of the disclosure. Referring to FIG. 5A and FIG. 5B, a semiconductor device SD2 includes a first package component PC1' and a second package component PC2' bonded to the first package component PC1'. It is appreciated that the illustrated structure of semiconductor device SD2 is merely an exemplary, and package components having different designs may be employed. For example, the first package component PC1' may be the same as or similar to the first package component PC1 described in FIG. 1A, and thus, the detailed descriptions are omitted herein. The second package component PC2' may be a similar structure to the semiconductor package SP1 described in FIG. 2J, and thus, details thereof are simplified for brevity. In some embodiments, the semiconductor device SD2 includes the third die 160' bonded to the first die 110 and the second die 120. The third die 160' may extend over the gap between the adjacent first die 110 and the second die 120. The first die 110 and the second die 120 are electrically coupled through the third die 160' (e.g., serving as a bridge structure), thereby transmitting signals therebetween.

The dielectric barrier DB1 of the second package component PC2' disposed on the redistribution structure 190 may be in direct contact with the conductive contacts CT so as to spatially separate the second portions CT2 of the conductive contacts CT from one another. The first package component PC1' is in physical and electrical contact with the second portions CT2 of the conductive contacts CT so as to electrically couple to the dies (e.g., 110, 120, and/or 160'). The height $H_{DB}'$ of the dielectric barrier DB1 at about the midway point between the most adjacent conductive contacts CT may be greater than the height of one of the second portions CT2, but may be less than the height of the corresponding first portion CT1. The dielectric barrier DB1 may have a curved top surfaces Sc. As shown in FIG. 5B, the recess R1 of the dielectric barrier DB1 forms a substantially dished shape profile between the most adjacent conductive contacts CT. The diameter of the recess R1 of the dielectric barrier DB1 is largest at the plane close to the first package component PC1' and smallest at the plane distal from the first package component PC1'. In some embodiments, the boundary lines of the dielectric barrier DB1 on the adjacent second portions CT2 define a first shortest distance DT1 on the first reference plane PL1. A second shortest distance DT2 is defined by the points of the profile of the dielectric barrier DB1 intersected with the interface plane PL0 (e.g., where the interface between the first portion CT1 and the second portion CT2 is located). The first shortest distance DT1 may be greater than the second shortest distance DT2. In some embodiments, the thickness of the dielectric barrier DB1 may decreases from the interface plane PL0 to the first reference plane PL1.

In certain embodiments in which the second portions CT2 includes solder-containing material, the second package component PC2' and the first package component PC1' are bonded by reflowing of melting second portions CT2, and then as the solder-containing material of the second portions CT2 is allowed to set, a reliable bond is formed between the second package component PC2' and the first package component PC1'. The signals of the dies (e.g., 110, 120, and/or 160') may be transmitted through the conductive contacts CT to the first package component PC1'. In some embodiments, the underfill layer UF including the filler materials FL fills in a space (including the recesses R1 of the dielectric barrier DB1) defined by the conductive contacts CT, the dielectric barrier DB1, and the first package component PC1' so as to improve the attachment between the first package component PC1' and the second package component PC2'. For example, the underfill layer UF is disposed between the redistribution structure 190 and the first package component PC1' and distributed between the adjacent conductive contacts CT. The underfill layer UF is separated from the first portions CT1 and at least a part of the corresponding second portions CT2 through the dielectric barrier DB1. As shown in FIG. 5B, the underfill layer UF is in physical contact with the top surfaces Sc of the dielectric barrier DB1. In some embodiments, the underfill layer UF may be in physical contact with parts of the second portions CT2 of the conductive contacts CT which are unmasked by the dielectric barrier DB1.

FIG. 6 is a schematic, enlarged cross-sectional view illustrating an area of a semiconductor device between a first package component and a second package component in accordance with some exemplary embodiments of the disclosure. The semiconductor device may be similar to the semiconductor device SD2, and the difference lies in the conductive contacts, and thus, the detailed descriptions are simplified herein. Referring to FIG. 6, in some embodiments, each conductive contact CT' includes the second portion CT2' having the maximum diameter $D_{CT2}$ greater than the maximum diameter $D_{CT1}$ of the first portion CT1. Accordingly, a distance between the most adjacent second portions CT2' are even closer, and an increased risk that conductive contacts CT' adjacent to one other may bridge during the reflow process. The dielectric barrier DB2 may serve as a spacer disposed on the sidewalls of the conductive contacts CT' so as to eliminate the bridging and undesired short circuit issues.

In some embodiments, the boundary BS2 of the dielectric barrier DB2 formed on the second portion CT2' is located on the first reference plane PL1 which is between the interface plane PL0 (e.g., where the interface between the first portion CT1 and the second portion CT2' is located) and the second reference plane PL2 (e.g., where the maximum diameter $D_{CT2}$ is located). In some embodiments, the boundary lines of the dielectric barrier DB2 on the adjacent second portions CT2' define the first shortest distance DT1' on the first reference plane PL1. The second shortest distance DT2' is defined by the points of the profile of the dielectric barrier DB2 intersected with the interface plane PL0. The first shortest distance DT1' may be less than or substantially equal to the second shortest distance DT2'. In some embodiments, the recess R2 of the dielectric barrier DB2 between two of the most adjacent first portions CT1 of the conductive contacts CT' may be formed in a first slope sequence in a cross-sectional plane, the recess R2 of the dielectric barrier DB2 between the two corresponding second portions CT2' may be formed in a second slope sequence in the cross-sectional plane, and one or more inflection points may be defined on the interface plane PL0 (e.g., where the interface between the first portion CT1 and the second portion CT2' is located). For example, the curve profile of the top surface BS2 of the dielectric barrier DB2 extending between the most adjacent conductive contacts CT' may change from being concave downward on the first portions CT1 to concave upward (convex) on the second portions CT2'.

According to some embodiments, a package contact structure includes a conductive contact and a dielectric barrier. The conductive contact includes a first portion and a second portion disposed on the first portion, where materials of the first portion and the second portion are different. The dielectric barrier is sleeved on the first portion and extends to cover at least a part of the second portion, where a maximum height of the dielectric barrier is less than a maximum height of the conductive contact.

According to some alternative embodiments, a semiconductor package includes an integrated circuit (IC) component structure, an insulating encapsulation, a redistribution structure, a plurality of conductive contacts, a dielectric barrier, a package component, and an underfill layer. The insulating encapsulation laterally encapsulates the IC component structure. The redistribution structure is disposed on the insulating encapsulation and the IC component structure, and electrically coupled to the IC component structure. The conductive contacts are disposed on the redistribution structure opposite to the insulating encapsulation, and electrically connected to the redistribution structure, where each of the conductive contacts includes a first portion connected to the redistribution structure, and a second portion connected to the first portion. The dielectric barrier is disposed on the redistribution structure, extends between respective ones of the conductive contacts, and is in contact with the conductive contacts to separate the second portions of the conductive contacts from one another. The package component is disposed on the second portions of the conductive contacts and electrically connected to the conductive contacts. The underfill layer is disposed between the redistribution structure and the package component, and distributed between the conductive contacts, where the underfill layer is separated from the first portions and at least a part of the corresponding second portions through the dielectric barrier.

According to some alternative embodiments, a manufacturing method of a semiconductor package includes at least the following steps. A redistribution structure is formed on an insulating encapsulation and an integrated circuit (IC) component structure, where the insulating encapsulation laterally encapsulates the IC component structure. A plurality of conductive features is formed on the redistribution structure, where each of the conductive features includes a first portion and a second portion, the first portion is in contact with the redistribution structure, and the second portion formed on the first portion includes a material different from the first portion. A dielectric material is formed on the redistribution structure to cover the first portions of the conductive features and extend to cover at least a part of the second portions of the conductive features. The conductive features and the dielectric material are reshaped to respectively form a plurality of conductive contacts and a dielectric barrier so that adjacent ones of the conductive contacts are spaced apart by the dielectric barrier.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package contact structure, comprising:
   a conductive contact, comprising a first portion and a second portion disposed on the first portion, wherein materials of the first portion and the second portion are different; and
   a dielectric barrier, sleeved on the first portion and extending to cover at least a part of the second portion, wherein a maximum height of the dielectric barrier is less than a maximum height of the conductive contact, and a minimum height of the dielectric barrier is less than a maximum height of the first portion of the conductive contact.

2. The package contact structure of claim 1, wherein a thickness of the dielectric barrier decreases from the first portion of the conductive contact to the second portion of the conductive contact.

3. The package contact structure of claim 1, wherein a maximum thickness of the dielectric barrier on the second portion of the conductive contact is less than about 3 µm.

4. The package contact structure of claim 1, wherein the dielectric barrier has a curvilinear surface surrounding the conductive contact.

5. The package contact structure of claim 1, wherein
the package contact structure is configured to electrically connect a first package component to a second package component, and
the package contact structure is configured to be covered by an underfill layer disposed between the first package component and the second package component, wherein the dielectric barrier and a part of the second portion unmasked by the dielectric barrier are in contact with the underfill layer.

6. The package contact structure of claim 1, wherein a surface area of the second portion of the conductive contact covered by the dielectric barrier is at least about 5% of a total surface area of the second portion of the conductive contact.

7. The package contact structure of claim 1, wherein a boundary of the dielectric barrier on the second portion of the conductive contact ends between an interface between the first portion and the second portion and a plane where a maximum diameter of the second portion is located.

8. A semiconductor package, comprising:
an integrated circuit (IC) component structure;
an insulating encapsulation, laterally encapsulating the IC component structure;
a redistribution structure, disposed on the insulating encapsulation and the IC component structure, and electrically coupled to the IC component structure;
a plurality of conductive contacts, disposed on the redistribution structure opposite to the insulating encapsulation, and electrically connected to the redistribution structure, wherein each of the conductive contacts comprises a first portion connected to the redistribution structure, and a second portion connected to the first portion;
a dielectric barrier, disposed on the redistribution structure, extending between respective ones of the conductive contacts, and being in contact with the conductive contacts to separate the second portions of the conductive contacts from one another, wherein a minimum height of the dielectric barrier is less than a maximum height of the respective first portion;
a package component, disposed on the second portions of the conductive contacts and electrically connected to the conductive contacts; and
an underfill layer, disposed between the redistribution structure and the package component, distributed between the conductive contacts, wherein the underfill layer is separated from the first portions and at least a part of the corresponding second portions through the dielectric barrier.

9. The semiconductor package of claim 8, wherein the dielectric barrier laterally covers the first portions of the conductive contacts and extends to cover at least a part of each of the second portions of the conductive contacts.

10. The semiconductor package of claim 8, wherein a viscosity of the underfill layer comprising a plurality of fillers is greater than a viscosity of the dielectric barrier that is free of fillers.

11. The semiconductor package of claim 8, wherein a thickness of the dielectric barrier between respective ones of the conductive contacts decreases from the first portions of the conductive contacts to the second portions of the conductive contacts.

12. The semiconductor package of claim 11, wherein a maximum thickness of the dielectric barrier on one of the second portions of the conductive contacts is less than about 3 μm.

13. The semiconductor package of claim 8, wherein the IC component structure comprises:
a first die and a second die, disposed side by side; and
a third die, disposed on the first and the second die, wherein the first die and the second die are electrically coupled through the third die.

14. A manufacturing method of a semiconductor package, comprising:
forming a redistribution structure on an insulating encapsulation and an integrated circuit (IC) component structure, wherein the insulating encapsulation laterally encapsulates the IC component structure;
forming a plurality of conductive features on the redistribution structure, wherein each of the conductive features comprises a first portion and a second portion, the first portion is in contact with the redistribution structure, and the second portion formed on the first portion comprises a material different from the first portion;
forming a dielectric material on the redistribution structure to cover the first portions of the conductive features and extend to cover at least a part of the second portions of the conductive features, wherein the dielectric material comprises a rough top surface; and
reshaping the conductive features and the dielectric material to respectively form a plurality of conductive contacts and a dielectric barrier so that adjacent ones of the conductive contacts are spaced apart by the dielectric barrier, wherein the rough top surface of the dielectric material is smoothened when reshaping the dielectric material.

15. The manufacturing method according to claim 14, wherein the dielectric material is dispensed in semi-liquid form on the redistribution structure, and then the dielectric material is cured to form the dielectric barrier.

16. The manufacturing method according to claim 15, wherein curing the dielectric material comprises:
subjecting the dielectric material to a temperature ranging from about 80° C. to about 150° C.

17. The manufacturing method according to claim 14, wherein forming the conductive features comprises:
forming a copper-containing material on the redistribution structure to form the first portions of the conductive features; and
forming a solder-containing material on the copper containing material to form the second portions of the conductive features.

18. The manufacturing method according to claim 17, wherein reshaping the conductive features comprises:
reflowing the second portions of the conductive features such that a top of each of the conductive contacts forms a hemispherical profile.

19. The manufacturing method according to claim 14, wherein before forming the redistribution structure, the method of laterally covering the IC component structure by the insulating encapsulation comprises:
forming a first encapsulant to encapsulate a first die and a second die, wherein the first die and the second die are disposed side by side;
forming a plurality of conductive connectors on the first die and the second die;
disposing a third die on the first die and the second die in a flip-chip manner, wherein the third die is surrounded by the conductive connectors; and
forming a second encapsulant to encapsulate the third die and the conductive connectors.

20. The manufacturing method according to claim 19, wherein
- before disposing the third die, a redistribution layer is formed on the first die, the second die, and the first encapsulant, and
- after disposing the third die, the third die and the conductive connectors are electrically coupled to the first die and the second die through the redistribution layer.

\* \* \* \* \*